United States Patent [19]
Sandhu

[11] Patent Number: 5,577,001
[45] Date of Patent: Nov. 19, 1996

[54] HIGH SPEED DIFFERENTIAL TO SINGLE ENDED SENSE AMPLIFIER

[75] Inventor: Bal S. Sandhu, Fremont, Calif.

[73] Assignee: Sun Microsystems

[21] Appl. No.: 590,489

[22] Filed: Jan. 24, 1996

Related U.S. Application Data

[62] Division of Ser. No. 357,859, Dec. 14, 1994, Pat. No. 5,521,874.

[51] Int. Cl.$^6$ ................................................ G11C 7/02
[52] U.S. Cl. ........................ 365/207; 365/208; 327/51; 327/52; 327/53
[58] Field of Search .................................. 365/207, 208; 327/51, 52, 53, 54, 55

[56]                References Cited

U.S. PATENT DOCUMENTS

| | | | |
|---|---|---|---|
| 4,475,178 | 10/1984 | Kinoshita | 365/203 |
| 4,654,831 | 3/1987 | Venkatesh | 365/207 |
| 4,725,984 | 2/1988 | Ip et al. | 365/189 |
| 4,802,138 | 1/1989 | Shimamune | 365/210 |
| 4,829,479 | 5/1989 | Mitsumoto | 365/189.09 |
| 4,903,237 | 2/1990 | Rao | 365/185 |
| 4,903,238 | 2/1990 | Miyatake et al. | 365/189.06 |
| 4,918,341 | 4/1990 | Galbraith et al. | 307/530 |
| 4,935,649 | 6/1990 | Bloker | 307/530 |
| 5,013,943 | 5/1991 | Hirose | 307/530 |
| 5,117,394 | 5/1992 | Amin et al. | 365/203 |
| 5,202,854 | 4/1993 | Koike | 365/203 |
| 5,227,697 | 7/1993 | Sakagami | 365/203 |
| 5,237,533 | 8/1993 | Papaliolios | 365/208 |
| 5,255,230 | 10/1993 | Chan et al. | 365/201 |
| 5,305,259 | 4/1994 | Kim | 365/189.09 |
| 5,355,343 | 10/1994 | Shu et al. | 365/203 |
| 5,357,468 | 10/1994 | Satani et al. | 365/189.01 |

OTHER PUBLICATIONS

A 25-ns 16K CMOS PROM Using a Four-Transistor Cell and Differential Design Techniques, Pathak et al., IEEE Journal of Solid-State Circuits, vol. SC-20, No. 5, Oct. 1985.
A 25-ns 16K CMOS PROM Using a 4-Transistor Cell, Pathak et al., IEEE Intl. Solid-State Circuits Conference, Feb. 1985.
A Fault-Tolerant 30 ns/375 mW 16Kx1 NMOS Static RAM, Hardee et al., IEEE Journal of Solid State Circuits, vol. SC-16, No. 5, Oct. 1981.
The Technology of a 1Mbit CMOS EPROM, by Guy Nelmes, New Electronics, vol. 18, No. 22.
A 1Mb CMOS EPROM with Enhanced Verification, 1988 IEEE Solid-State Circuits Conference, Digest of Technical Papers, Feb. 1988.
Principles of CMOS VLSI Design, A Systems Perspective, Weste et al., pp. 362-364, Jun. 1988.

Primary Examiner—David C. Nelms
Assistant Examiner—F. Niranjan
Attorney, Agent, or Firm—Steven F. Caserza; Flehr, Hohbach, Test, Albritton & Herbert

[57]                ABSTRACT

A differential to single ended sense amplifier utilizes a minimum number of stages to convert a differential input signal received from complementary bit lines to a single ended output signal indicative of the state of the data stored in a selected memory cell connected to the complementary bit lines. The circuit is constructed to operate with low voltage swings, thereby increasing the switching speed and thus the sense speed. The sense amplifier includes power down capabilities and the ability to tristate its output terminal while in a standby mode of operation during which it is capable of reading the logic level of an input signal. In one embodiment, the output signal is latched using a simple register when the output stage goes tristated, to continue to provide a valid output signal while a subsequent sense operation is performed.

10 Claims, 5 Drawing Sheets

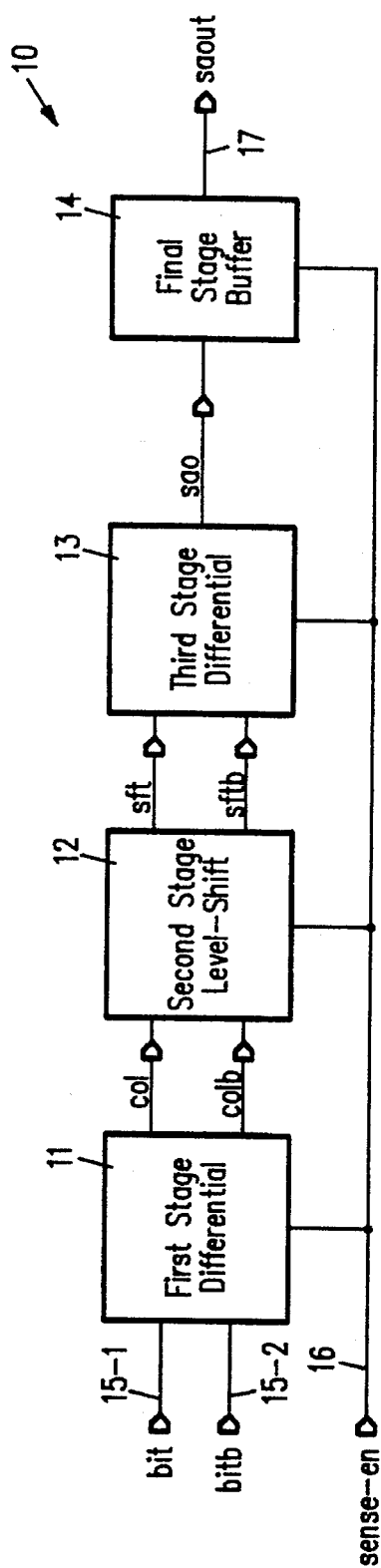
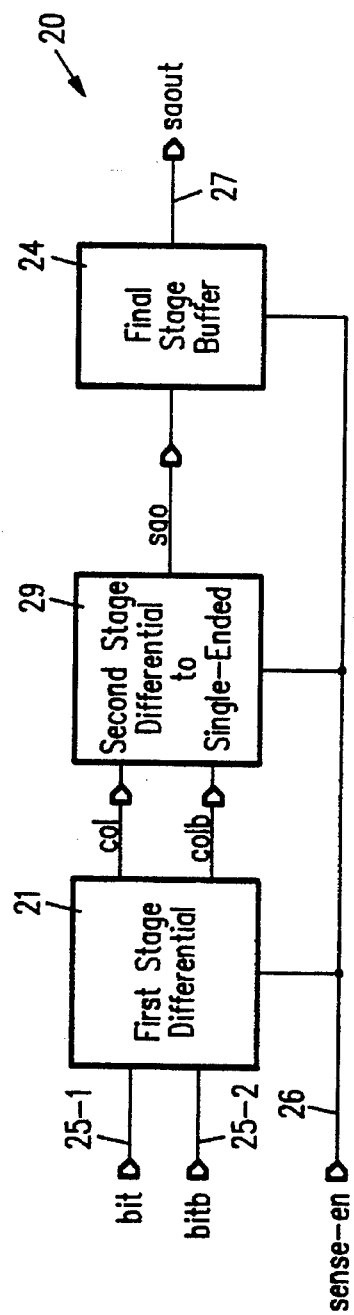
PRIOR ART
FIG. 1
FIG. 3a

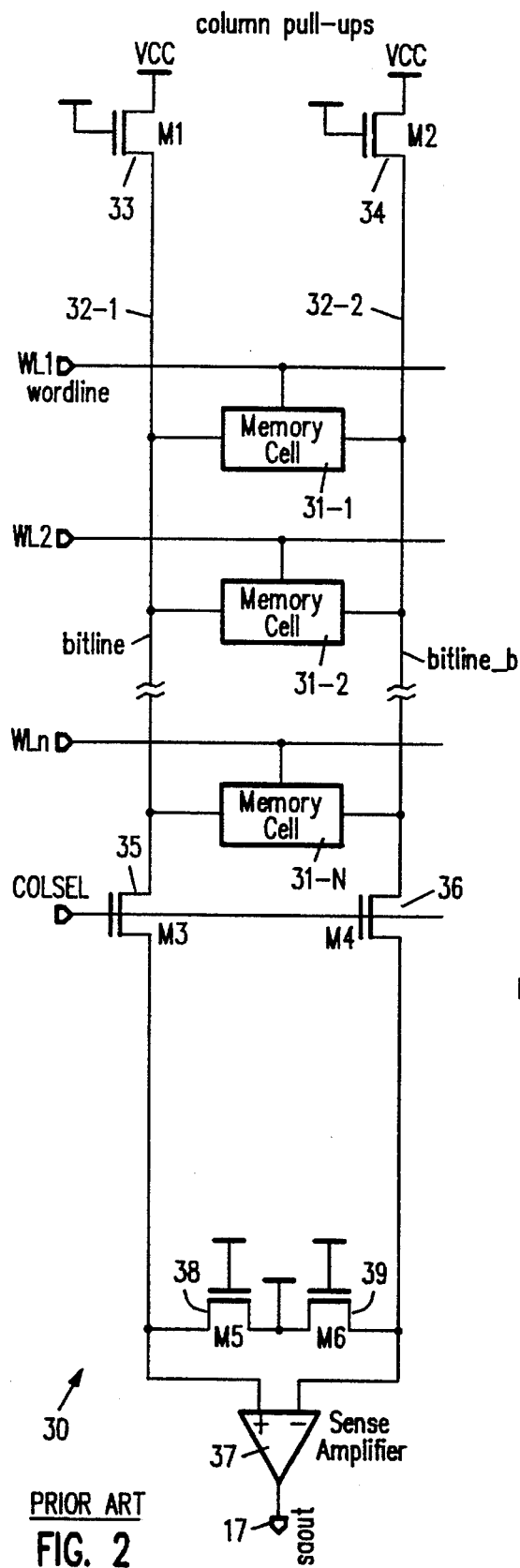
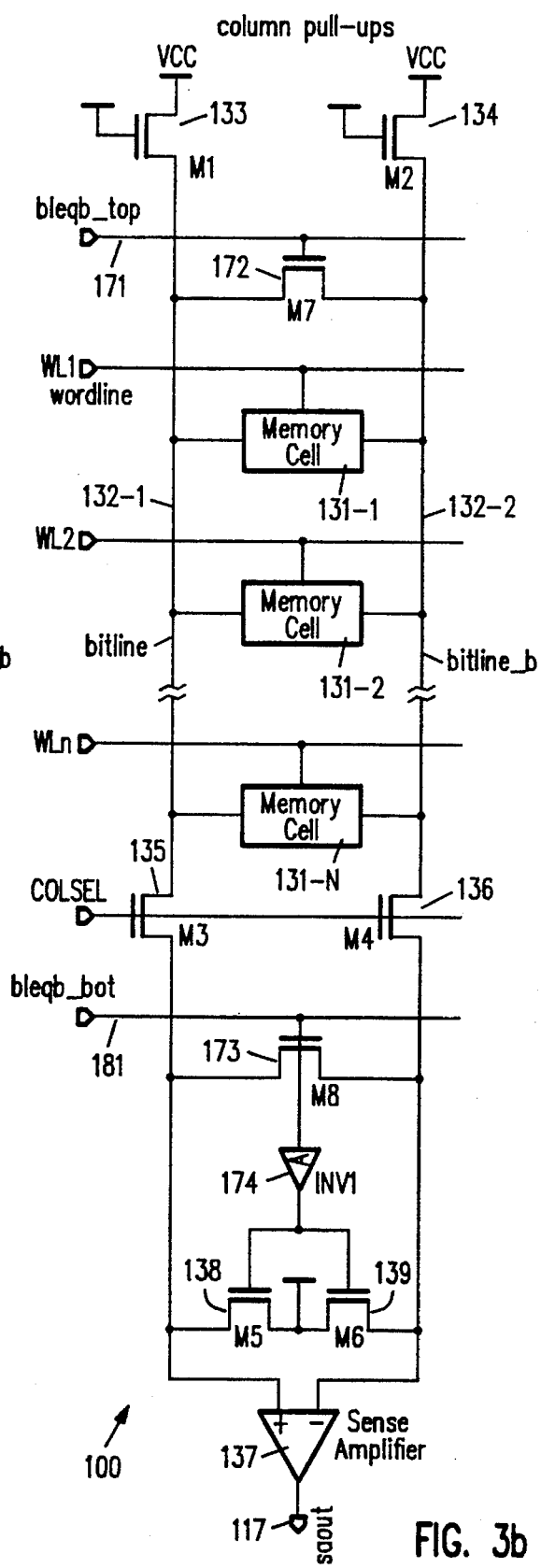
PRIOR ART
FIG. 2
FIG. 3b

HIGH SPEED DIFFERENTIAL TO SINGLE ENDED SENSE AMPLIFIER

This is a division of application Ser. No. 08/357,859 filed Dec. 14, 1994, now U.S. Pat. No. 5,521,874.

INTRODUCTION

1. Field of the Invention

This invention pertains to integrated circuits and in particular to memory circuits utilizing sense amplifiers for high speed reading of data stored in the memory array.

2. Description of Prior Art

Sense amplifiers are commonly used in memory circuits to detect the logical state stored in a selected memory cell contained within an array of memory cells. Such sense amplifiers are either single ended sense amplifiers, sensing the voltage level on a single bit line, or differential sense amplifiers which sense the voltage difference across a pair of differential bit lines.

Typically, a simple single ended sense amplifier is an invertor and requires a relatively large input signal on the bit line in order to properly sense the logical state stored in a selected memory cell. The large input voltage swing required to trip the single ended sense amplifier means that the time required to perform a sensing of a logical state in a selected memory cell will be relatively slow since the memory cell current provided on the single ended bit line can vary between about 20 microamps to 100 microamps. This requires a large voltage swing on the input to the sense amplifier, (i.e. the bit line) in order to switch the output signal of the sense amplifier. Hence, due to the large capacitance of the bit line, this sensing can take a significant amount of time and thus this type of sense amplifier has limited applications. It is known the prior art that a single ended sense amplifier can be made faster by utilizing a lower voltage swing on the bit line and a low trip point invertor as a sense amplifier, and including feedback circuitry which will limit the total voltage swing on the bit line. However, such prior art circuits lead to other problems, such as higher sensitivity to noise, including power supply noise, and greater sensitivity to a variation in memory cell currents, for example caused by variations in channel length and threshold voltages. Examples of such prior art single ended sense amplifiers are given in U.S. Pat. Nos. 4,918,341; 4,935,649; and 5,013,943.

In a differential sense amplifier, both a bit line and a complementary bit line provide signals as input to the differential sense amplifier. These complementary bit lines provide voltages which swing in opposite directions when reading a memory cell, with the voltage swing depending on the logical state stored in the selected memory cell being read. Differential sense amplifiers require a significantly smaller voltage swing to sense the logical state of the data stored in the selected memory cell.

A block diagram of a typical prior art differential sense amplifier is shown in FIG. 1. Complementary bit lines bit and bitb are shown labeled as 15-1 and 15-2, respectively, and are connected to the input leads of differential first stage 11 of sense amplifier 10. Since the voltage swing on the bit lines 15-1 and 15-2 is small, typically around 100 to 200 millivolts, first stage differential amplifier 11 must provide a differential output voltage swing on lines col and colb which are fed as input signals to second stage level shift circuit 12 in order to provide a suitable differential signal on output leads sft and sftb which can drive as input signals a third differential amplifier stage 13. The third differential amplifier stage 13 provides a single ended output signal on line sao having a greater voltage swing (typically within a range of approximately 0.8 to 4.0 volts) to final stage buffer amplifier 14, which provides a sense amplifier output signal saout on output lead 17. Requiring a second stage level shift circuit 12 to be used between first stage differential amplifier 11 and third stage differential amplifier 13 has a number of significant disadvantages. First, the area required on an integrated circuit to provide these circuits is rather large, particularly when you consider that a typical memory chip will have on the order of 8 to 64 differential sense amplifiers. Secondly, with a greater number of components as shown in the prior art circuit of FIG. 1, power requirements are increased. In addition, speed is decreased due to the greater number of components.

FIG. 2 is a diagram depicting a portion of a typical prior art memory circuit including a differential sense amplifier 37. Memory circuit 30 includes a pair of columns 32-1 and 32-2 serving as complementary bit lines, between which are placed a plurality of memory cells 31-1 through 31-n. Associated with each memory cell is a word line WL1 through WLn, respectively, which serves to address a selected one of the memory cells. Bit lines 32-1 and 32-2 are pulled high by N channel column pull-up transistors 33 and 34, respectively, which are tied between columns 32-1 and 32-2 and VCC, respectively, with their gates tied to VCC so that they are always on. In practice, column pull-up transistors 33 and 34 are either strobed in order to precharge bit lines 32-1 and 32-2, or are always on weakly, thereby tending to pull up toward VCC bit lines 32-1 and 32-2. Bit lines 32-1 and 32-2 are thus clamped by transistors 33 and 34 to approximately VCC-VTN, where VTN is the threshold voltage of N channel pull-up transistors 33 and 34, when bit lines 32-1 and 32-2 are selected for a read operation. Pull-up transistors 38 and 39 are coupled to the input leads of sense amplifier 37, with the gates of transistors 38 and 39 being tied to VCC, in order to further precharge bit lines 32-1 and 32-2 which are selected by column select transistors 35 and 36, an may function in a similar matter as column pull-up transistors 33 and 34.

The voltage swing of bit lines 32-1 and 32-2 is determined by the sizing of pull-up transistors 33 and 34, with the size of pull-up transistors 33 and 34 determining how much the bit line can be pulled low when a memory cell is being read. The larger the size of pull-up transistors 33 and 34, the lower the bit line swing resulting from the reading of a memory cell which is programmed to a logical zero. When a given memory cell is to be read, it's associated word line is enabled, as is the COLSEL signal. With the given memory cell enabled by an active word line, and bit lines 33-1 and 33-2 coupled to sense amplifier 37 via enabled column select transistors 35 and 36, the logical state stored in the selected memory cell is detected by sense amplifier 37 and an appropriate signal saout indicative of the stored logical state is provided on OUTPUT Terminal 17. This type of prior art differential memory circuit requires that the selected memory cell during reading overcome the pull-up effects provided by pull-up transistors 33 and 34, as well as the pull-up effects of data line pull up transistors 38 and 39, which requires a certain amount of time to allow the selected memory cell to discharge the precharged bit lines 33-1 or 33-2, which are continually supplied with some pre-charged current by pull-up transistors 33, 34, and 38 and 39.

SUMMARY

In accordance with the teachings of this invention, a novel differential to single ended sense amplifier is taught. The sense amplifier of this invention utilizes a minimum number of stages to convert a differential input signal received from complementary bit lines to a single ended output signal indicative of the state of the data stored in a selected memory cell connected to the complementary bit lines. The circuit is constructed to operate with low voltage swings, thereby increasing the switching speed and thus the sense speed. The sense amplifier includes power down capabilities and the ability to tristate its output terminal while in a standby mode of operation during which it is capable of reading the logic level of an input signal. In one embodiment, the output signal is latched using a simple register when the output stage goes tristated, to continue to provide a valid output signal while a subsequent sense operation is performed. The circuit is also suitable for use in a memory structure including a single bit line and a dummy bit line, to which is connected one or more dummy memory cells.

BRIEF DESCRIPTION OF THE DRAWINGS

FIG. 1 is a block diagram of a typical prior art differential sense amplifier;

FIG. 2 is a block diagram depicting a typical prior art memory device including complementary bit lines and a differential sense amplifier;

FIG. 3a is a block diagram depicting one embodiment of the novel differential sense amplifier of the present invention;

FIG. 3b is a block diagram depicting a novel memory structure of this invention, including complementary bit lines and a novel differential sense amplifier;

DETAILED DESCRIPTION

Figure 4:
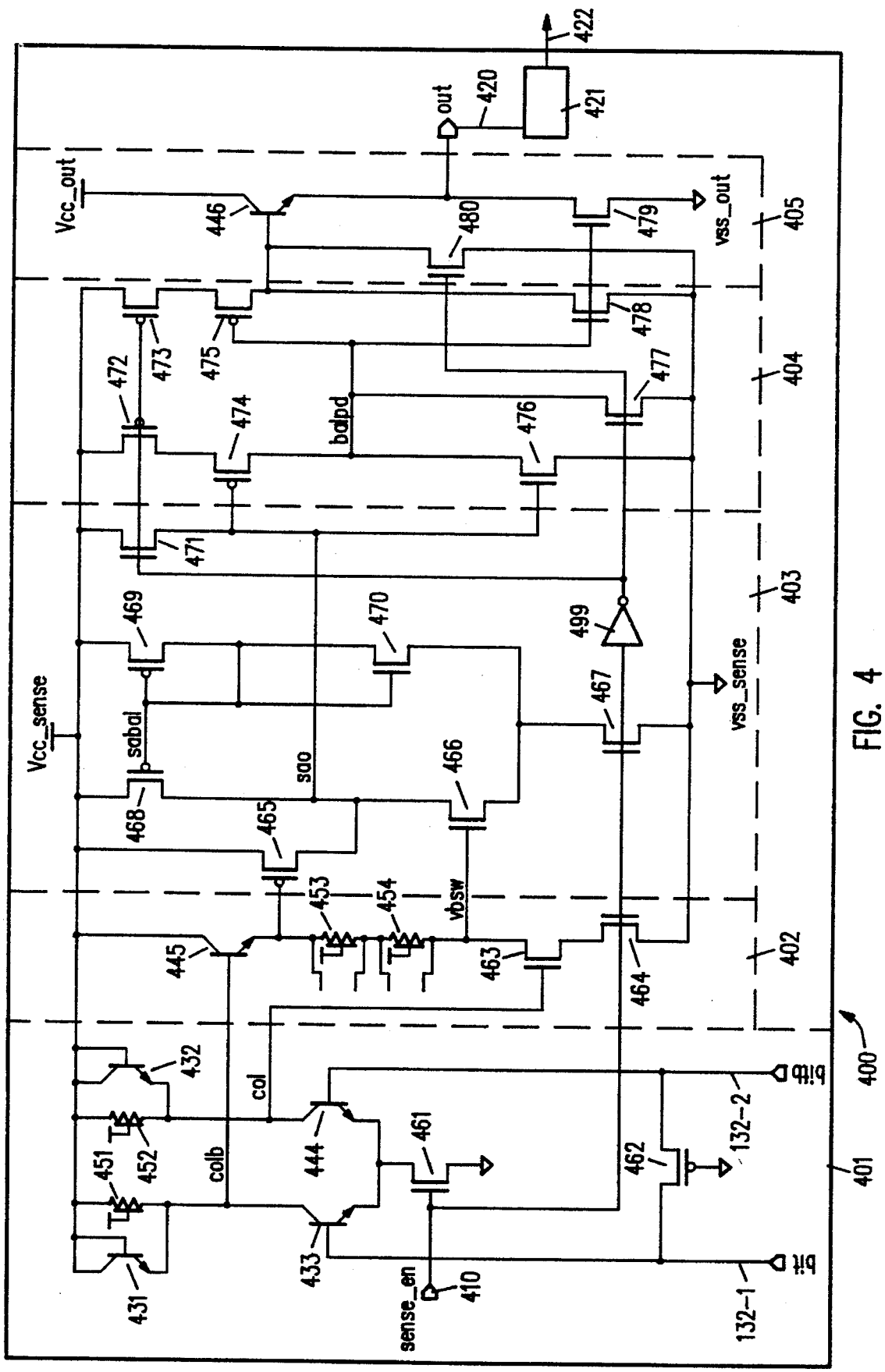
FIG. 4 is a schematic diagram depicting one embodiment of a novel differential sense amplifier constructed in accordance with the teachings of this invention.

FIG. 3a is a block diagram of one embodiment of a novel differential sense amplifier constructed in accordance with the teachings of this invention. Differential sense amplifier 20 includes a differential first stage 21 receiving a complementary bit line signals bit and bitb on input leads 25-1 and 25-2, respectively. Differential first stage 21 provides a differential output signal col and colb to a second stage 29. Second stage 29 combines a level shift operation with a differential stage to form a single stage which performs a differential to single conversion while receiving the relatively low voltage swing differential input signal COL and COLB available from differential first stage 21. As a feature of this invention, second stage 29 provides a higher gain and faster differential to single ended conversion as compared with the circuits available in the prior art, such as second and third stages 12 and 13 of the prior art sense amplifier 10. Sense amplifier 20 of FIG. 3a also includes the final buffer stage 24 which buffers the single ended output signal sao from second stage 29 to provide a buffered output signal saout on output lead 27.

While this detailed description is directed to an embodiment of this invention which is used with a memory device having complementary bit lines, it is to be understood that the teachings of this invention are also suitable for use with a memory device which utilizes a single bit line and a dummy bit line, to which is connected one or more dummy memory cells to establish a differential bit and bitb signal as is known in the art. The use of such dummy memory cells and dummy bit lines to form DRAMs is shown, for example, in *Principles of CMOS VLSI Design—A Systems Perspective*, Neil Weste & Kamran Eshraghian, Addison Wesley, 1988.

FIG. 3b is a diagram depicting one embodiment of a memory circuit 100 constructed in accordance with the teachings of this invention. Memory circuit 100 includes a plurality of memory cells 131-1 through 131-n coupled between complementary bit lines 132-1 and 132-2, each memory cell having an associated word line WL1 through WLn. Column select transistors 135 and 136 serve to couple bit lines 132-1 and 132-2, respectively to the differential input leads of sense amplifier 137 in response to the column select signal COLSEL. Bit lines 132-1 and 132-2 are pulled up with pull-up circuits 133 and 134, respectively, which can be any convenient pull-up circuit including, for example, N channel, P channel, or bipolar transistors. Shown in the embodiment of FIG. 3b, column pull-up circuits 133 and 134 are each formed by a weak N channel transistor which serve to weakly bias bit lines 132-1 and 132-2, respectively, to voltage levels of approximately VCC-VTN. Also as shown in the embodiment of FIG. 3b are balancing P channel transistors 172 and 173 which serve to balance the voltage levels of bit lines 132-1 and 132-2, with balancing transistor 172 being placed near the top of the column, and balancing transistor 173 being placed near the bottom of the column. Balancing transistors such as transistors 172 and 173 serve to bring the bit line voltages together, in response to balancing signals bleqb—top and bleqe—bot received on leads 171 and 181, respectively, going low.

In contrast to the prior art circuit of FIG. 2, pull up transistors 138 and 139 serve to pull up the bottom of bit lines 132-1 and 132-2 near the input leads of sense amplifier 137, but only as a precharge operation and are not active during the actual reading of the voltage swings on bit lines 132-1 and 132-2. Thus, during the precharge operation, the bleqb_top and bleqb_bot signals applied to leads 171 and 181, respectively, are active low, causing balance transistors 172 and 173 to turn on, balancing the voltage levels on complementary bit lines 132-1 and 132-2 and causing pull-up transistors 138 and 139 to be turned on by the output signal of inverter 174, thereby providing additional pull-up to complementary bit lines 132-1 and 132-2. When reading of a selected one of memory cells 132-1 and 131-N is to take place, bleqb_top and bleqb_bot signals are disabled, turning off balance transistors 172 and 173, and also turning off pull up transistors 138 and 139. Thus, at this time only pull up transistors 133 and 134, which are weak pull up transistors, continue to precharge bit lines 132-1 and 132-2. The word line associated with the desired memory cell is made active and then column select signal COLSEL is made active, allowing the logical state stored in the selected memory cell to affect the precharged voltage levels of either bit line 132-1 or bitb line 132-2. At this time, since pull up transistors 138 and 139 are disabled, the selected memory cell need only overcome the charge stored on the bit lines during the precharge operation and the weak pull ups provided by pull up transistors 133 and 134.

FIG. 4 is a schematic diagram of one embodiment of a differential to single ended sense amplifier 400 which may conveniently serve as a sense amplifier 37 of FIG. 3A of prior art memory circuit 30 of FIG. 3A, or as sense amplifier 137 of the novel memory circuit 100 of FIG. 3B. Sense amplifier 400 includes differential input stage 401, a differential to single ended stage which includes level shift single ended substage 402 and translation stage 403, invertor stage 404, and output buffer stage 405.

Differential input stage 401 is formed of a differential pair of transistors 433 and 444 which in this embodiment are NPN transistors having their bases connected to complementary bit lines 132-1 and 132-2 for receiving complementary bit line signals bit and bit. The emitters of differential input transistors 433 and 444 are coupled in common to current source transistor 461 which is controlled by sense enable signal sense_en applied to enable terminal 410. When sense amplifier 400 is disabled, the sense_en signal disables current source 461, as well as other current sources in stages 402, 403 and 404, thereby essentially powering down sense amplifier 401 and tri-stating its output lead 420. The collectors of differential input transistors 433 and 444 are coupled to VCC through load devices 431, 451, and 432, 452, respectively. In this embodiment, load transistors 431 and 432 are NPN transistors connected as load devices between the collectors of differential input transistors 433 and 444 and VCC. Also, in this embodiment, load devices 451 and 452 are conveniently formed as load resistors. Weak transistor 462 serves to minimize any offset voltage on the bit lines by limiting the voltage swing on their collectors, since they turn on when the column voltage drops to about Vcc-Vbe.

The collectors of differential input transistors 444 and 433 serve as differential output leads of differential input stage 401, providing complementary signal col and colb to the differential to single ended stage formed of substages 402 and 403. Substage 402 serves as a level shift to single ended output stage and includes a series connection of NPN transistor 445, resistors 453 and 454, and N channel transistor 463, which are coupled between VCC and current source transistor 464. The gates of transistors 445 and 463 are coupled to signals colb and col, respectively. In one embodiment, resistors 453 and 454 are formed as current limiting resistors having values determined by the input voltage $V_{BSW}$ required for stage 403. In one embodiment, one or more of resistors 453 and 454 are shorted out during fabrication (for example by a metal jumper), reducing their value to 0, which is useful for operation at lower VCC voltage levels. Stage 402 provides a first output signal to drive the gate of P channel transistor 465, and a second output signal to drive the gate of N channel transistor 466. These two output signals are single ended in that they both rise or fall together in response to the col and colb signals but since transistor 465 is P channel and transistor 466 is N channel, these transistors operate differentially.

In operation, when a logical zero is read from a selected memory cell, the bit signal on bit line 132-1 drops with respect to the complementary bit signal on bit line 132-2. In one embodiment, as the bit signal drops more than about 80 millivolts lower than the bit signal, differential input stage 401 starts to amplify this voltage swing as complementary output signals colb and col, with an approximately 600 millivolt differential signal being fed to level shift to single ended output stage 402. The voltage swing on the collectors of transistors 433 and 444 is limited by the resistance values of resistors 451 and 452 and is clamped to a minimum value no lower than VCC-Vbe by diode connected transistors 431 and 432. Thus, while a logical zero is read, the bit signal falls with respect to the bitb signal, causing the colb signal to rise with respect to the col signal. As the colb signal rises to almost VCC, the base of NPN transistor 445 is driven higher, which pulls up signal vbsw, which drives the gate of N channel transistor 466, higher. At the same time, the col signal drops, which drives the base of N channel transistor 463 less, somewhat turning off transistor 463, and adding to the effect of an increased vbsw voltage level. With the voltages applied to the gates of P channel transistor 465 and N channel transistor 466 increasing, P channel transistor 465 turns off and transistor 466 is turned on hard. The actions of transistors 465 and 466 cause signal sao to be pulled low, toward VSS (ground).

With signal sao low, P channel transistor 474 is turned on, and N channel transistor 476 is turned off. This causes signal botpd to go high, which in turn turns on N channel transistors 478 and 479 and turns off P channel transistor 475. This causes the base of NPN pull up transistor 446 to be pulled low, turning off NPN transistor 446 while N channel pull down transistor 479 is on, pulling down output terminal 420.

Conversely, when a logical one is read from a selected memory cell, the bit signal on bit line 132-1 remains substantially constant with respect to the complementary bit signal on bit line 132-2. With no change in this voltage difference, there is substantially no change on complementary output signals colb and col. Thus, while logical one is read, the base of NPN transistor 445 remains biased to approximately VCC-VBE which causes signal vbsw to be lower, which drives the gate of N channel transistor 466 such that transistor 466 is weakly conducting. At the same time, the col signal drives the base of N channel transistor 463 such that Vbsw is lower. With the voltage applied to the gate of P channel transistor 465 causing P channel transistor 465 to be weakly conducting and the voltage applied to the base of N channel transistor 466 causing transistor 466 to be weakly off, signal sao is pulled high, toward VCC by transistors 468 and 465.

With signal sao high, P channel transistor 474 is turned off, and N channel transistor 476 is turned on. This causes signal botpd to go low, which in turn turns off N channel transistors 478 and 479 and turns on P channel transistor 475. This causes the base of NPN pull up transistor 446 to be pulled high, turning on transistor 446, pulling up output terminal 420, while N channel pull down transistor 479 is off.

Figure 5:
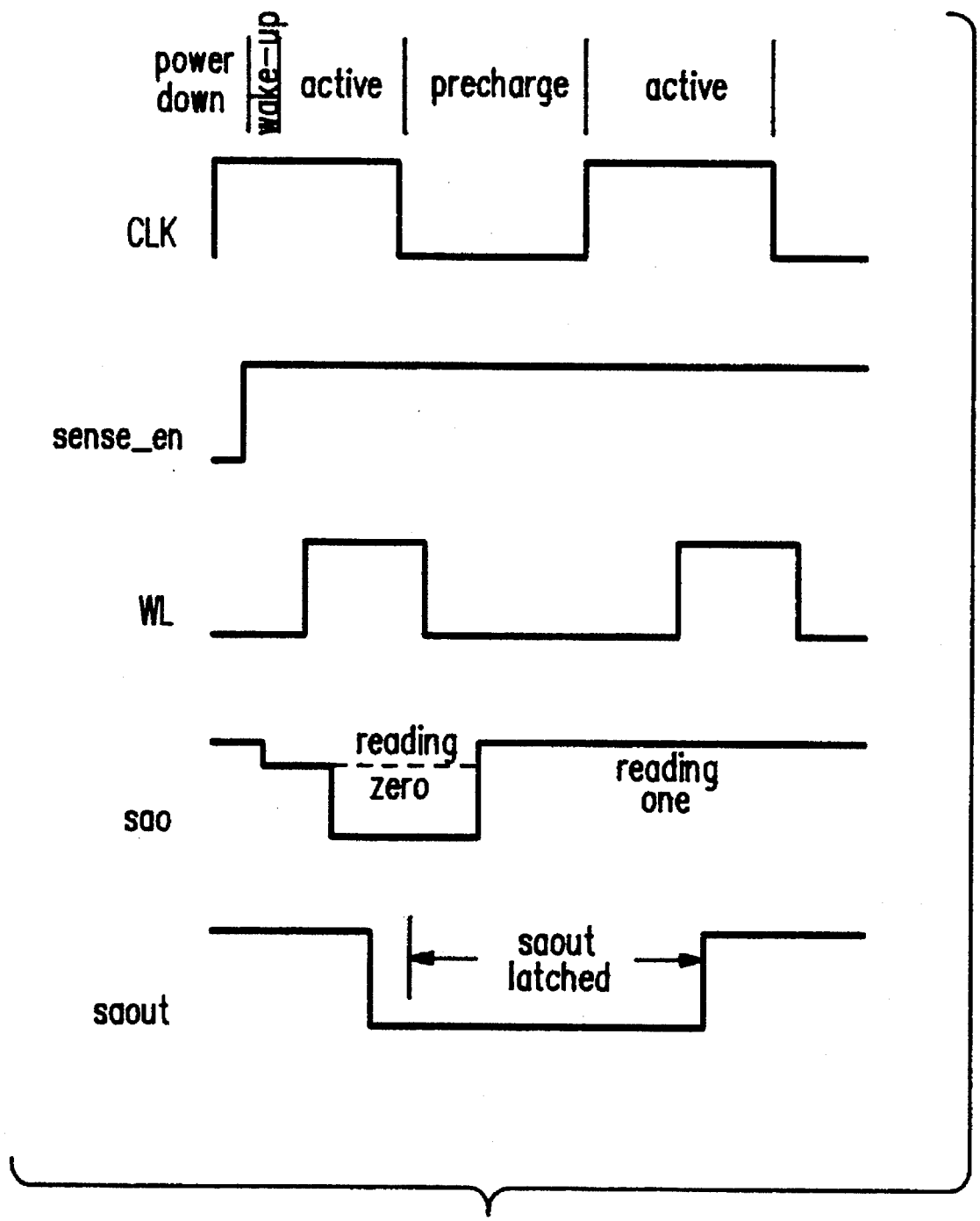
FIG. 5 is a set of timing diagrams depicting the operation of the circuit of FIG. 4.

FIG. 5 is a timing diagram depicting the operation of the embodiment of a sense amplifier construction in accordance with the teachings of this invention shown in FIG. 4. As shown in FIG. 5, initially sense amplifier 400 is in the power down mode, meaning that the sense_en signal is low, disabling current sources 461, 464, and 467, and tri-stating output terminal 420. Next, during a wakeup period, the sense_en signal is raised high, enabling current sources 461, 464, and 467 of sense amplifier 400. Since during the power down mode bit lines 132-1 and 132-2 were precharged, upon wakeup sense amplifier 400 is active and in response to an active word line signal WL selecting an appropriate memory cell for reading, sense amplifier 400 operates as described above to provide an intermediate signal sao on output terminal 420 indicative of the stored state of the memory cell being read. The sao signal is latched in latch 421 to provide a latched version of this valid output data on output terminal 422 during the subsequent precharge cycle and a portion of the subsequent active sense cycle until subsequently read data is valid. During this time, output terminal 420 is tri-stated.

Of interest, in the embodiment of FIG. 4, when current sources 464 and 467 are disabled (during the power down mode), signal sabal is driven to VCC-VTP by P channel transistor 469, and signal sao is driven to VCC by weak P channel transistor 465 being slightly turned on by transistor 445 loosing Vbe from its base, and N channel transistor 471 being on until signal sao reaches VCC-VTN. Also, signal vbsw is biased to a voltage VCC-VBE since current source transistor 464 is turned off and the voltage of signal colb is substantially VCC. With the sense_en signal low, the output of invertor 499 is high, and thus P channel transistors 472 and 473 are off and N channel transistors 471, 480, and 477 are turned on. Thus, signal botpd and the base of NPN bipolar pull-up transistor 446 are pulled to ground (VSS). Therefore, during the power down mode of sense amplifier 400, output stage 405 is tri-stated, signal sao is driven high which in effect means that sense amplifier 400 is reading an "intrinsic" logical one, and sense amplifier 400 is powered down, consuming substantially zero power. Thus, during reading, no switching takes place in response to sensing a logical one stored signal within the selected memory cell, and switching takes place only when a logical zero state is stored in the selected memory cell. Upon providing a valid output signal the valid data is latched, as previously described.

Of interest, sense amplifier node sao is in this embodiment designed to swing around approximately VCC-VT (a logical one) and VSS+VT (logic zero), a voltage swing significantly less than full rail-to-rail swing, resulting in a significantly higher speed sense amplifier.

Upon wakeup, and sensing of a selected memory cell, if the signal bit does not go lower than signal bit, the sense amp is still reading a logical one after its "wake-up", which means signal sao is high. In this case, signal botpd is pulled down to VSS and turns off transistors 478 and 479 and turns on transistors 475 and 446, thus pulling up output node 420 to VCC-VBE. If in the previous cycle a logic high is latched on the saout node than transistor Q6 acts to sustain the logic high value and consumes very low power.

The last state of the sense amplifier is the recovery or precharge mode. As the clock goes low the output of the sense amplifier is latched and the bit lines are brought back together by the equalization transistor on the bit lines. As the signals bit and bit come back together, than colb and col also return to their preset values for reading a logical one. Hence, the node sao starts being precharged back to reading a one ready for the next cycle.

Figure 6:
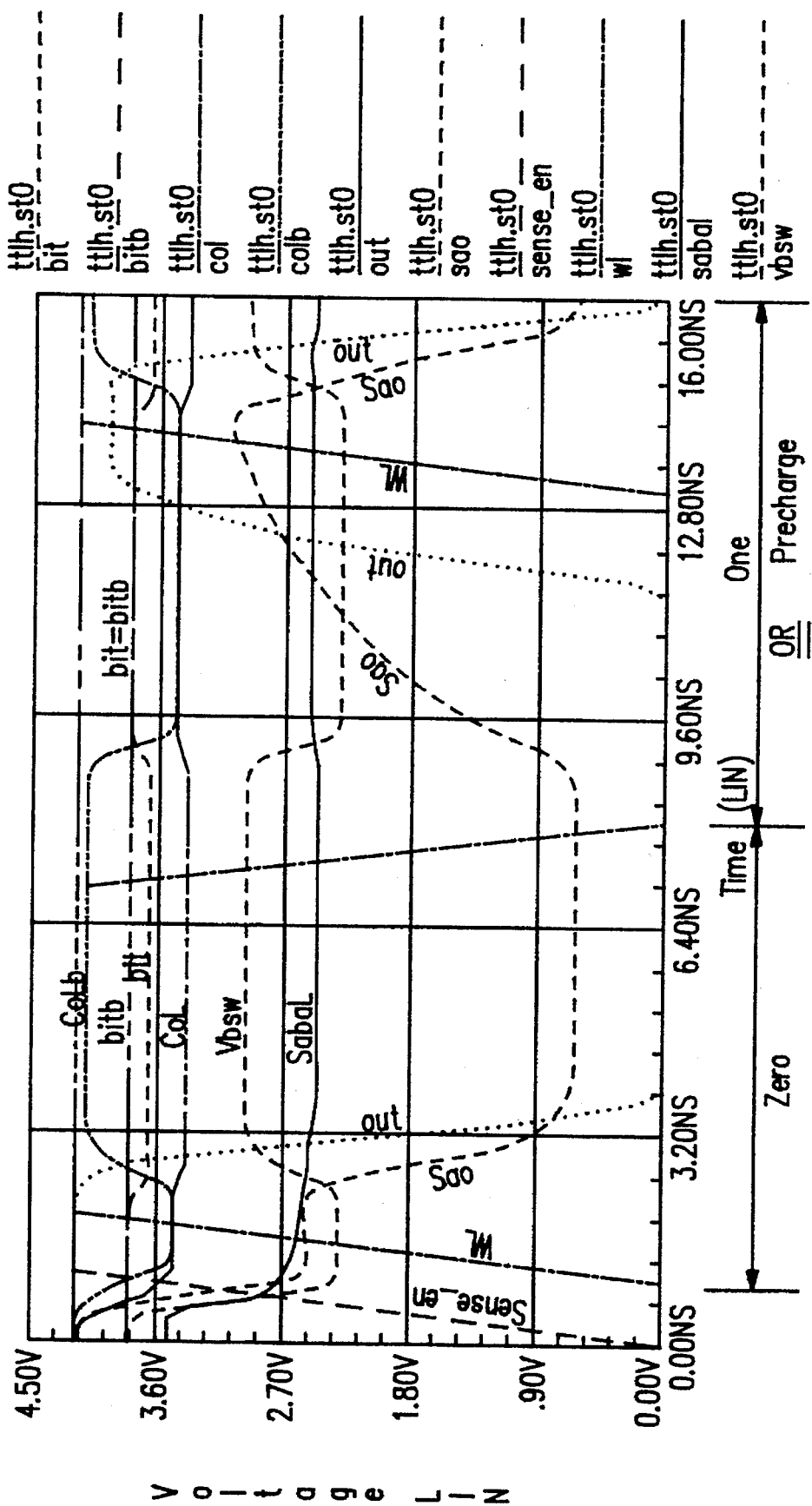
FIG. 6 is a set of waveforms depicting the results of the operation of the circuit of FIG. 4.

FIG. 6 depicts the switching characteristics of one embodiment of the circuit of this invention, as depicted in FIG. 4. Referring to FIG. 6, waveforms pertaining to the following signals (made with reference to the schematic diagram of FIG. 4) are shown: sense_en, sao, out, colb, bit, bit, vbsw, sabal, and out.

All publications and patent applications mentioned in this specification are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed:

1. A differential sense amplifier comprising:
    an input lead;
    a complementary input lead;
    a differential input stage comprising:
        an output lead;
        a complementary output lead;
        an input stage current source;
        an input transistor having a first current handling lead coupled to said input stage current source, a second current handling lead coupled to said output lead of said input stage, and a control lead coupled to said input lead; and
        a complementary input transistor having a first current handling lead coupled to said input stage current source, a second current handling lead coupled to said complementary output lead of said input stage, and a control lead coupled to said complementary input lead;
    a differential to single ended stage, comprising:
        a first current source; and
        a first and second transistor coupled in series between a first supply voltage and said first current source, said first transistor being coupled to receive a control signal from said output lead of said input stage and provide in response thereto a first intermediate signal, and said second transistor being coupled to receive a control signal from said complementary output lead of said input stage and provide in response thereto a second intermediate signal, said first and second intermediate signals both swinging in the same direction in response to said complementary input signal;
    a translation stage comprising a pair of input transistors, operating differentially, a first being coupled to receive said first intermediate signal and a second being coupled to receive said second intermediate signal, and providing a single ended intermediate signal; and
    an output stage coupled to said translation stage to provide a single ended output signal in response to said differential input signal.

2. A differential sense amplifier as in claim 1 wherein said second current handling lead of said input transistor is coupled to a supply voltage through a load device and said second current handling lead of said complementary input transistor is coupled to a voltage supply through a second load device.

3. A differential sense amplifier as in claim 1 wherein said first load device comprises a resistor and said second load device comprises a resistor.

4. A differential sense amplifier as in claim 3 wherein said first load device further comprises a bipolar transistor connected across said first resistor, and wherein said second load device further comprises a bipolar transistor coupled across said second resistor.

5. A structure as in claim 1 wherein said first and second transistors of said differential to single ended stage are coupled in series with one or more current limiting resistors.

6. A method for operating a differential sense amplifier comprising the steps of:
    providing an input lead;
    providing a complementary input lead;
    providing a differential input stage comprising:
        an output lead;
        a complementary output lead;
        an input stage current source;
        an input transistor having a first current handling lead coupled to said input stage current source, a second current handling lead coupled to said output lead of said input stage, and a control lead coupled to said input lead; and
        a complementary input transistor having a first current handling lead coupled to said input stage current source, a second current handling lead coupled to said complementary output lead of said input stage, and a control lead coupled to said complementary input lead;

providing a differential to single ended stage, comprising:
   a first current source; and
   a first and second transistor coupled in series between a first supply voltage and said first current source, said first transistor being coupled to receive a control signal from said output lead of said input stage and provide in response thereto a first intermediate signal, and said second transistor being coupled to receive a control signal from said complementary output lead of said input stage and provide in response thereto a second intermediate signal, said first and second intermediate signals both swinging in the same direction in response to said complementary input signal;

providing a translation stage comprising a pair of input transistors, operating differentially, a first being coupled to receive said first intermediate signal and a second being coupled to receive said second intermediate signal, and providing a single ended intermediate signal; and providing an output stage coupled to said translation stage to provide a single ended output signal in response to said differential input signal.

7. A method as in claim 6 wherein said second current handling lead of said input transistor is coupled to a supply voltage through a load device and said second current handling lead of said complementary input transistor is coupled to a voltage supply through a second load device.

8. A method as in claim 6 wherein said first load device comprises a resistor and said second load device comprises a resistor.

9. A method as in claim 8 wherein said first load device further comprises a bipolar transistor connected across said first resistor, and wherein said second load device further comprises a bipolar transistor coupled across said second resistor.

10. A method as in claim 6 wherein said first and second transistors of said differential to single ended stage are coupled in series with one or more current limiting resistors.

* * * * *